United States Patent
Fisher et al.

(10) Patent No.: US 6,937,120 B2
(45) Date of Patent: Aug. 30, 2005

(54) CONDUCTOR-WITHIN-A-VIA MICROWAVE LAUNCH

(75) Inventors: Charles Robert Fisher, Satellite Beach, FL (US); Anders P. Pedersen, Palm Bay, FL (US); Walter M. Whybrew, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 82 days.

(21) Appl. No.: 10/405,792

(22) Filed: Apr. 2, 2003

(65) Prior Publication Data

US 2004/0196122 A1 Oct. 7, 2004

(51) Int. Cl.$^7$ ............................ H01P 3/08; H01P 1/04
(52) U.S. Cl. ................. 333/246; 333/260; 174/266
(58) Field of Search ............................ 333/246, 247, 333/260, 33; 174/266

(56) References Cited

U.S. PATENT DOCUMENTS

| | | | |
|---|---|---|---|
| 5,508,666 A | | 4/1996 | Nguyen ........................ 333/33 |
| 5,668,509 A | * | 9/1997 | Hoffmeister et al. .......... 333/33 |
| 5,797,765 A | * | 8/1998 | Barnett et al. ................. 439/63 |
| 6,166,705 A | | 12/2000 | Mast et al. .................... 343/853 |
| 6,441,697 B1 | | 8/2002 | Garland et al. ............... 333/34 |
| 6,617,526 B2 | * | 9/2003 | Miller ......................... 174/261 |

* cited by examiner

Primary Examiner—Benny Lee
(74) Attorney, Agent, or Firm—Allen, Dyer, Doppelt, Milbrath & Gilchrist, P.A.

(57) ABSTRACT

A concentric 'conductor within a via' RF interconnect architecture, has an inner via through which at least one RF signal conductor passes. The inner conductive via is coaxially formed within and stably coaxially aligned within an outer conductive via, which serves as a coaxial ground plane that completely surrounds the inner conductive via. The outer conductive via passes through dielectric layers of microstrip or stripline structures on opposite sides of a multi printed circuit laminate.

2 Claims, 3 Drawing Sheets

CONDUCTOR-WITHIN-A-VIA MICROWAVE LAUNCH

FIELD OF THE INVENTION

The present invention relates in general to communication systems and components therefor, and is particularly directed to a new and improved 'conductor-within-a-via', microwave interconnect structure for use with laminated radio frequency (RF) printed circuit architectures.

BACKGROUND OF THE INVENTION

Laminated printed circuit architectures employed for RF (microwave/millimeter wave) applications use a variety of feed-through configurations for transporting RF signals between opposite sides of a substrate laminate. One of these structures, shown diagrammatically in plan in FIG. 1, distributes a plurality of ground vias (four being shown at 11, 12, 13 and 14 in FIG. 1) around an RF feed-through pin 15 which, in turn, is connected to a microstrip launch conductor 16. A problem with this approach is the relatively poor shielding offered by the 'punctuated' arrangement of spaced apart ground vias, which typicaly results in leakage to one or more internal layers of printed circuit conductor traces. In addition, the feed-through suffers from transition mismatch, making the RF pass-through lossy and degrades the voltage standing wave ratio (VSWR).

Another structure, termed 'sloppy coax' and disclosed in U.S. Pat. No. 6,166,705, is shown in cross-section in FIG. 2. This structure has a plated aperture 20 through the substrate laminate 21, the plated aperture being conductively connected to ground plane conductors 22 and 23 on opposite surfaces of the substrate. RF throughput is provided by an insulated wire 24, which is bonded to an RF terminal pad 25 on one side of the substrate, inserted through the plated aperture 20 and then terminated at an RF pad 26 on the opposite side of the substrate. A dielectric layer 27 surrounds the conductor within the aperture 20. A problem with this structure is the fact that its manufacture is labor-intensive (in passing the RF conductor through the plated aperture and making the wire bonds to the RF terminal pads). In addition, in order to make connections to the RF terminal pads, the wire contains respective loops 28 and 29, which add unwanted inductance and serve as above-the-surface radiators.

SUMMARY OF THE INVENTION

In accordance with the present invention, problems of conventional RF feed-throughs, such as those described above, are effectively obviated by a concentric 'conductor within a via' RF interconnect architecture, having an inner conductive via that serves as the RF signal conductor, that is coaxially formed within and stably coaxially aligned within an outer conductive via, which serves as a coaxial ground plane that completely surrounds the inner conductive via.

Pursuant to a first microstrip-coupling embodiment, an outer via or aperture extends through a substrate laminate, so as to intersect ground plane layers formed on the substrate's opposite surfaces. A conductive material is formed on the ground plane layers and also on the generally cylindrical sidewall of the outer aperture, so as to effectively extend the ground plane layers into the outer aperture or via. This cylindrical ground plane layer serves as a first, outer coaxial, grounded shielding via for the RF pass-through. A dielectric fill layer is formed in the outer ground plane-coated via and serves both to define the impedance of the RF pass-through and to provide for structural alignment and stability of a subsequently formed inner plated through-via. Dielectric layers are then formed on the two planar ground plane layers and on the dielectric fill layer. After RF microstrip conductor layers have been formed on these additional dielectric layers to realize a microstrip transmission line, a second, inner through-via is then formed therethrough, as well as the fill layer along the axis of the outer via. A conductive layer is then deposited on the microstrip conductor layers and on the sidewall of the inner through-via, so that the two microstrip conductor layers are interconnected by the coaxial conductive layer, thereby completing the RF launch structure. This microstrip-coupling RF launch structure offers significant performance improvement over the launch configurations of the prior art (e.g., FIGS. 1 and 2), since its RF signal center conductor is fully shielded by the surrounding ground plane layer and has a relatively low inductance owing to the minimal length of the RF signal conductor layer.

A stripline-coupling modification of the conductor-within-a-via architecture the first embodiment may be realized by augmenting the above-described embodiment to include additional dielectric layers, respectively formed on the first pair of dielectric layers and on the further conductive layer atop the RF microstrip conductor layers. A ground connection through-via is then formed though the additional dielectric layers so as to expose the ground plane layer. A further conductor layer is then formed on the surface of the additional dielectric layers and into the ground connection through-via and onto the ground plane layer to complete the structure.

In accordance with a further modification of the microstrip-coupling RF launch architecture of the invention, an insulated wire is employed as the RF center conductor. The wire is inserted into a relatively small concentric bore through the dielectric fill layer. Opposite, relatively short end portions of the wire are then bonded to the RF microstrip conductor layers on the respective dielectric layers. Replacing the plate inner via with an insulated wire effectively corresponds to shrinking the diameter of the hollow portion of the RF center conductor layer of the first embodiment to zero.

The conductor-in-a-via architecture of the invention may also be applied to a solid or all metal substrate. In accordance with this further embodiment, an all metal generally planar substrate serves as a ground plane. An epoxy-filled bore extends between opposite planar surfaces of the substrate. Prepreg insulator layers are formed on opposite surfaces of the substrate and overlie the epoxy filled bore. Printed wiring boards overlie the prepreg layers, and additional conductive layers are formed on the printed wiring boards. A through-the-substrate bore is formed through the prepreg layers, the printed wiring boards and the epoxy fill material within the interior bore. A layer of conductive material is then formed on the outer conductive layers and also on the sidewall of the interior bore, providing a signal connection through the substrate between the outer conductor layers. In this all metal substrate embodiment, the interior conductor serves as the signal path, while the conductive substrate provides a surrounding coaxial ground plane shield.

DETAILED DESCRIPTION OF THE INVENTION

Figure 3:
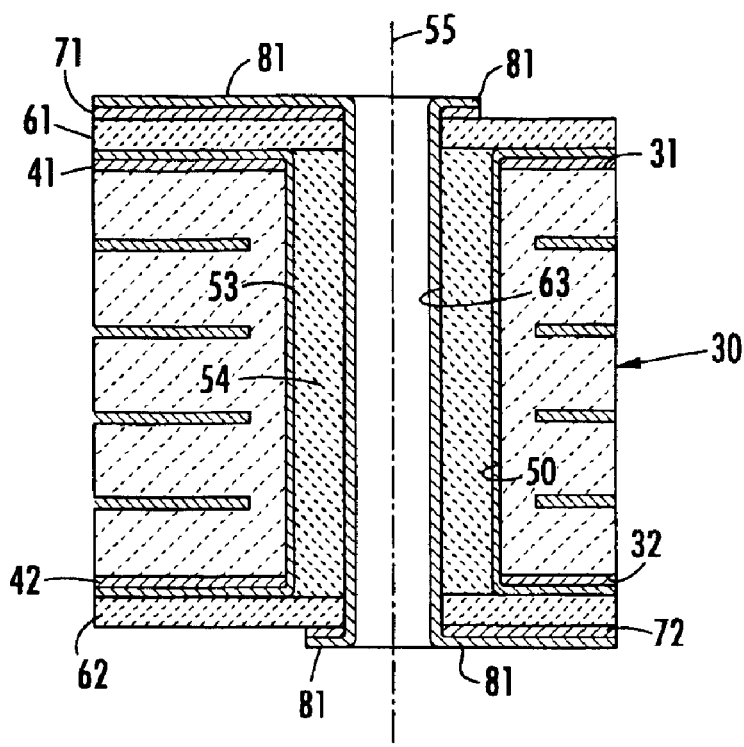
FIG. 3 diagrammatically illustrates a first microstrip-coupling embodiment of the shielded microwave conductor within a via interconnect structure in accordance with the present invention.

A first microstrip-coupling embodiment of the improved conductor within a via, shielded microwave interconnect structure in accordance with the present invention is diagrammatically illustrated in FIG. 3 as comprising a substrate 30 having first and second, generally parallel, opposite planar surfaces 31 and 32, and containing a laminate structure of multiple printed circuit layers therein. A first ground plane layer 41 is formed on the first planar surface 31, while a second ground plane layer 42 is formed on the second surface 32. A first, outer via or aperture 50 (which may be formed as a drilled cylindrical through hole) extends through the substrate 30 along an axis 55, so that it intersects the ground plane layers 41 and 42 on the respective opposite surfaces 31 and 32.

A conductive material is formed on the first and second ground plane layers 41 and 42, respectively, and also on the (generally cylindrical) sidewall of the aperture 50. In addition to thickening the ground plane layers 41 and 42, this conductive material effectively extends the ground plane layers into the outer aperture, to realize a generally cylindrical ground plane layer 53 along the sidewall of the outer aperture 50. As pointed out above, this cylindrical ground plane layer serves as a first, outer coaxial, grounded shielding via that surrounds the RF pass-through. A dielectric fill layer 54 (such as a ceramic-filled polymeric resin) is then formed in the plated aperture 50. This dielectric fill layer serves both to define the impedance of the RF pass-through and to provide for structural alignment and stability of a subsequently formed inner plated through-via.

First and second dielectric layers 61 and 62 are respectively formed on the first and second ground plane layers 41 and 42, and on the dielectric fill layer 54. Following the formation of the dielectric layers 61 and 62, RF microstrip conductor layers 71 and 72 are formed on respective dielectric layers 61 and 62. A second, inner through-via 63 is then formed through microstrip conductor layers 71, 72, the dielectric layers 61, 62 and the fill layer 54 along the axis 55. A conductive layer 81 is formed on the microstrip conductor layers 71 and 72, and on the (cylindrical) sidewall of the inner through-via 63, so that the microstrip conductor layers are interconnected by the conductive layer 81.

Figure 1:
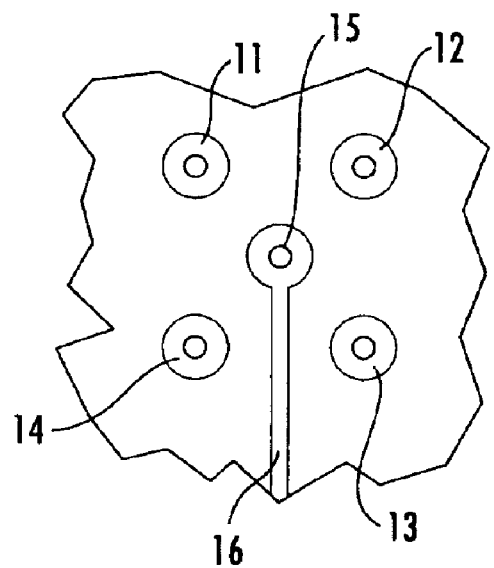
FIG. 1 is a diagrammatic plan view of a multi-grounded via-based RF feed-through architecture.
Figure 2:
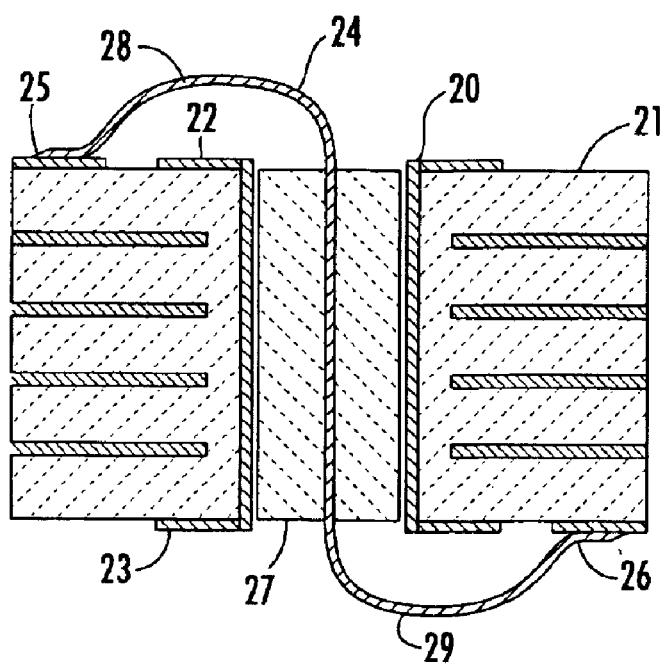
FIG. 2 is a cross-sectional view of a 'sloppy coax' RF feed-through structure.

From the foregoing description, it can be seen that the microstrip-coupling RF launch structure of FIG. 3 is, in effect, a concentric 'conductor within a via' RF interconnect architecture, in that the inner conductive via 81, which serves as the RF signal conductor, is coaxially formed and stably coaxially aligned within the outer conductive via 50, which serves as a coaxial ground plane that completely surrounds inner conductive via 81. Advantageously, the structure of FIG. 3 provides a significant performance improvement over the launch configurations of FIGS. 1 and 2, since its RF signal center conductor 81 is fully shielded by the surrounding ground plane layer 50, and has a relatively low inductance owing to the minimal length of the RF signal conductor layer 81 (no loops or projecting bends of conductor material in the vicinity of its connections with microstrip conductor layers 71 and 72 on opposite sides of the substrate).

Figure 4:
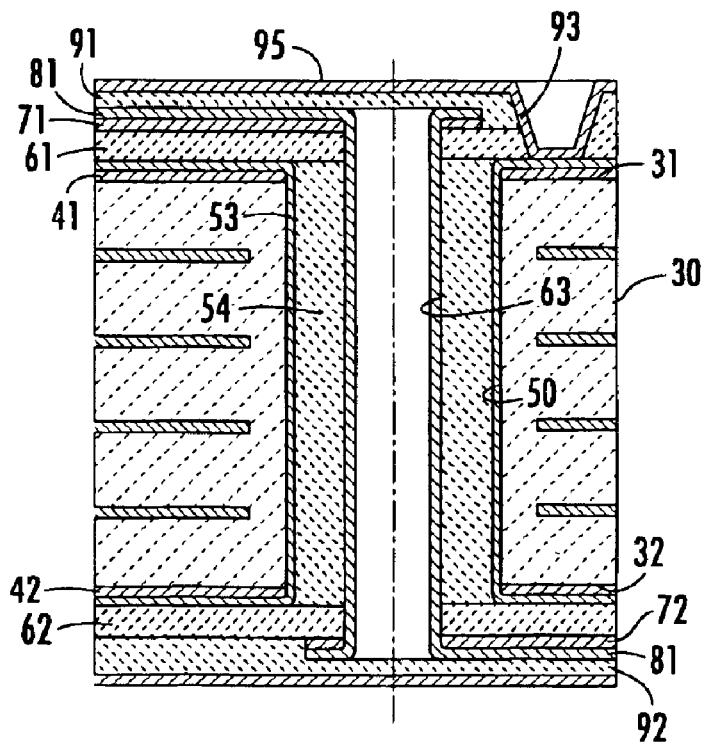
FIG. 4 diagrammatically illustrates a stripline-coupling embodiment of the shielded microwave interconnect structure in accordance with the present invention.

FIG. 4 shows a stripline-coupling modification of the conductor-within-a-via architecture of FIG. 3 to include additional dielectric and ground plane layers for use with a stripline-configured RF transmission line structure. For this purpose, the substrate 30 of the embodiment of FIG. 3, which includes opposite planar surfaces 31 and 32, and first and second ground plane layers 41 and 42, respectively, and a dielectric fill layer 54, is augmented to include fifth and sixth dielectric layers 91 and 92, that are respectively formed on the first and second dielectric layers 61 and 62 and on the further conductive layer 81 atop RF microstrip conductor layers 71 and 72. A ground connection via 93 is then formed though the dielectric layers 61 and 71, so as to expose the conductive layer 53 atop the ground plane layer 41. (A similar ground connection via may be formed through dielectric layers 62 and 72, if desired. FIG. 4 shows only single via to reduce the complexity of the drawings.) A further conductor layer 95 is then formed on the surface of the dielectric layers 91 and 92 into the ground connection through-via 93 and onto the thickened ground plane layer 41 to complete the structure.

Again, like the microstrip-coupling RF launch structure of FIG. 3, the stripline-coupling launch embodiment of FIG. 4 is a concentric 'conductor within a via' RF interconnect architecture, with the inner RF signal conductor 81 being coaxially formed and stably coaxially aligned within the outer conductive via 50, which serves as a coaxial ground plane that completely surrounds the inner conductive via 63, and is connected to the stripline ground plane by way of the ground connection through-via 93.

Figure 5:
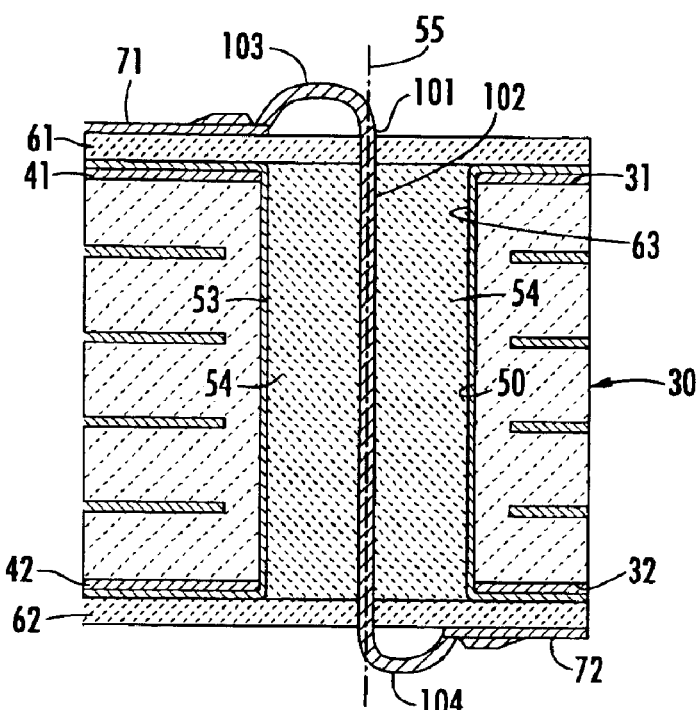
FIG. 5 diagrammatically illustrates a second microstrip-coupling embodiment of the shielded microwave interconnect structure in accordance with the present invention.

FIG. 5 illustrates another modification of the microstrip-coupling architecture of FIG. 3. Like the embodiment of FIG. 3, described above, opposite planar surfaces 31 and 32 of substrate 30 have respective first and second ground plane layers 41 and 42. A conductive material is formed on a sidewall of aperture 50 to realize a generally cylindrical ground plane layer 53. In this embodiment an uninsulated wire is employed as the RF center conductor; namely, the diameter of the hollow portion of the cylindrical inner via 81 of the embodiment of FIG. 3 is effectively reduced to zero, so that, as shown in FIG. 5, the plated RF center conductor layer 81 within the center via 63 of the embodiment of FIG. 3 effectively becomes an uninsulated wire 101. Wire 101 is inserted into a relatively small bore 102 that is formed along axis 55 through the dielectric fill layer 54, and is sized to accommodate the wire 101 for secure retention. Opposite, relatively short end portions 103 and 104 of the wire 101 are then bonded to the RF microstrip conductor layers 71 and 72 on the respective dielectric layers 61 and 62.

Figure 6:
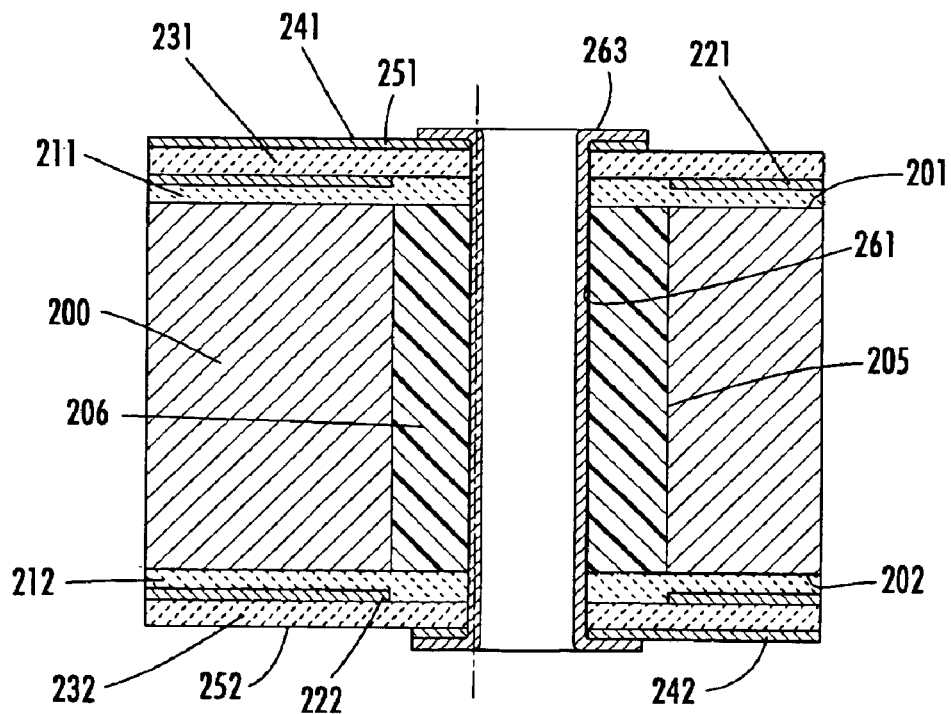
FIG. 6 illustrates the application of the conductor-in-a-via architecture of the invention to an all metal/conductive substrate.

FIG. 6 illustrates the application of the conductor-in-a-via architecture of the invention to a solid or all metal/conductive substrate. As shown therein, an all metal (e.g., aluminum), generally planar substrate 200, which serves as a ground plane, has first and second, generally parallel, opposite planar surfaces 201 and 202. An epoxy-filled bore 205 extends between the opposite planar surfaces 201 and 202 of the substrate. A first prepreg insulator layer 211 is formed on the first planar surface 201, while a second prepreg insulator layer 212 is formed on the second surface 202. The prepreg layers 211 and 212 overly the bore 205 and contain respective conductor (e.g., copper) layers 221 and 222 selectively patterned thereon. First and second printed wiring boards 231 and 232 overlie the prepreg layers, and additional conductive layers 241 and 242 are formed on top surfaces 251 and 252 of the printed wiring boards 231 and 232, respectively.

An interior, through-the-substrate (generally cylindrical) aperture or bore 261 is formed through the conductive layers 241, 242, the prepreg layers 211, 212, the printed wiring boards 231, 232, and epoxy fill material 206 within the interior bore 205. A layer of conductive material 263 is then formed on the outer conductive layers 241 and 242, and also on the sidewall of the aperture 261, so as to provide a signal connection through the substrate between conductor layers 241 and 242. In the embodiment of FIG. 6, the interior conductor 263 serves as the signal path, while the conductive substrate 200 provides a surrounding coaxial ground plane shield.

As will be appreciated from the foregoing description, shortcomings of conventional RF feed-throughs, including those employing distributions of ground vias and sloppy coax structures, are effectively obviated by the concentric 'conductor within a via' RF interconnect architecture of the invention, which as its RF signal center conductor fully shielded by the surrounding ground plane layer and has a relatively low inductance owing to the minimal length of the RF signal conductor layer.

While we have shown and described several embodiments in accordance with the present invention, it is to be understood that the same is not limited thereto but is susceptible to numerous changes and modifications as known to a person skilled in the art. We therefore do not wish to be limited to the details shown and described herein, but intend to cover all changes and modifications as are obvious to one of ordinary skill in the art. As a non-limiting example, the single RF signal conductor or conductive layer that passes through or is formed in the inner via may be replaced by plural RF signal conductors, so as to allow multiple RF signal paths to traverse a common inner via, and be shielded by the ground plane of the outer via. A balanced transmission line is one application where this alternative configuration may be employed.

What is claimed is:

1. A radio frequency (RF) launch architecture for a printed circuit arrangement comprising:
    a microstrip structure disposed on a ground plane layer overlying a surface of said printed circuit arrangement;
    an outer ground plane via passing through said printed circuit structure and interconnected with said ground plane layer; and
    an inner RF signal via coaxial with and extending through said outer ground plane via and interconnected to said microstrip structure, wherein
    said printed circuit arrangement comprises a substrate having first and second surfaces, said ground plane layer comprises a first ground plane layer disposed on said first surface of said substrate, and further including a second ground plane layer disposed on said second surface of said substrate, and wherein said outer ground plane via comprises an aperture extending between said first and second surfaces of said substrate and containing conductive material that is interconnected with first and second ground plane layers, said microstrip structure includes a first dielectric layer disposed on said first ground plane layer and a first microstrip signal layer disposed on said first dielectric layer, and further including an additional microstrip structure having a second dielectric layer disposed on said second ground plane layer, and a second microstrip signal layer disposed on said second dielectric layer, and wherein said inner RF signal via is interconnected to said additional microstrip structure, and further comprising
    a third dielectric layer disposed on said first microstrip signal layer;
    a third ground plane layer disposed on said third dielectric layer; and
    a conductive via passing through said first and third dielectric layers and interconnecting said third ground plane layer with said first ground plane layer.

2. The RF launch architecture according to claim 1, further comprising:
    a fourth dielectric layer disposed on said second microstrip signal layer; and
    a fourth ground plane layer disposed on said fourth dielectric layer.

* * * * *